United States Patent
Tsai et al.

(10) Patent No.: US 8,816,358 B1
(45) Date of Patent: Aug. 26, 2014

(54) PLASMONIC NANOSTRUCTURES FOR ORGANIC IMAGE SENSORS

(71) Applicant: Taiwan Semiconductor Manufacturing Co., Ltd., Hsin-Chu (TW)

(72) Inventors: Shu-Ju Tsai, Tainan (TW); Yeur-Luen Tu, Taichung (TW); Cheng-Ta Wu, Shueishang Township (TW); Cheng-Yuan Tsai, Chu-Pei (TW); Chia-Shiung Tsai, Hsin-Chu (TW); Xiaomeng Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/934,296

(22) Filed: Jul. 3, 2013

(51) Int. Cl.
*H01L 27/15* (2006.01)
*H01L 31/12* (2006.01)
*H01L 33/00* (2010.01)
*H01L 51/42* (2006.01)
*H01L 51/44* (2006.01)
*H01L 31/0232* (2014.01)

(52) U.S. Cl.
CPC ...... *H01L 31/02325* (2013.01); *H01L 51/4213* (2013.01); *H01L 51/44* (2013.01)
USPC .......... 257/79; 257/95; 257/98; 257/E33.001; 257/E31.127

(58) Field of Classification Search
USPC ........ 257/79, 80, 81, 89, 91, 95, 98, E33.001, 257/E31.127
See application file for complete search history.

(56) References Cited

U.S. PATENT DOCUMENTS

2012/0286305 A1* 11/2012 Sasaki et al. .................... 257/89

OTHER PUBLICATIONS

Qin Chen, et al.; "CMOS Photodetectors Integrated With Plasmonic Color Filters"; IEEE Photonics Technology Letters, vol. 24, No. 3, Feb. 1, 2012, p. 1-3.
Ting Xu, et al.; "Plasmonic Nanoresonators for High-Resolution Colour Filtering and Spectral Imaging"; Nature Communications, May 17, 2010, p. 1-5.
Shu-Ju Tsai; "Spectroscopic Enhancement From Noble Metallic Nanoparticles"; Department of Material Science and Engineering; 2011; p. 1-176.

* cited by examiner

*Primary Examiner* — Hoai V Pham
(74) *Attorney, Agent, or Firm* — Eschweiler & Associates, LLC

(57) ABSTRACT

Some embodiments of the present disclosure relate to an optical sensor. The optical sensor includes a first electrode disposed over a semiconductor substrate. A photoelectrical conversion element, which includes a p-type layer and an n-type layer, is arranged over the first electrode to convert one or more photons having wavelength falling within a predetermined wavelength range into an electrical signal. A second electrode is disposed over the photoelectrical conversion element. The second electrode is transparent in the predetermined wavelength range. A color filter element, which is made up of plasmonic nanostructures, is disposed over the second electrode.

20 Claims, 5 Drawing Sheets

PLASMONIC NANOSTRUCTURES FOR ORGANIC IMAGE SENSORS

BACKGROUND

Before a snapshot appears on a display of a digital camera, a lens in the camera focuses an image onto an optical sensor made up of an array of photo-detectors. This array of photo-detectors converts the light of the image into electrical signals that are used to generate a digital encoding of the image.

Conventional optical sensors are less than ideal for several reasons. For example, conventional optical sensors do not absorb light as accurately as possible, due to scattering or radiative transitions re-directing photons away from the photodetectors. Further, because individual photo-detectors are often, in-and-of themselves, unable to differentiate between different colors of light, color filter arrays (CFAs) with separate color filters for red, blue, and green light are often arranged over photodetector arrays. As shown in FIG. 1A-1C, however, these conventional color filters are less than perfect. Whereas an ideal blue color filter (transmission spectrum 102) would allow perfect transmission of visible blue light while perfectly attenuating other portions of the electromagnetic spectrum as shown in FIG. 1A, conventional blue color filters (transmission spectrum 104) block some blue light and allow other portions of the electromagnetic spectrum to pass. As shown in FIG. 1B, the same is true of conventional green color filters 106 (compared to ideal green color filters 108); and as shown in FIG. 1C is also true of conventional red filters 110 (compared to ideal red color filters 112).

Consequently, the present disclosure provides improved optical sensors that make use of plasmonic nanostructures. These plasmonic nanostructures can be used to better confine the light impingent towards the optical sensors, and/or can also be used to better filter the light provided to the optical sensors.

DETAILED DESCRIPTION

Figure 1A:
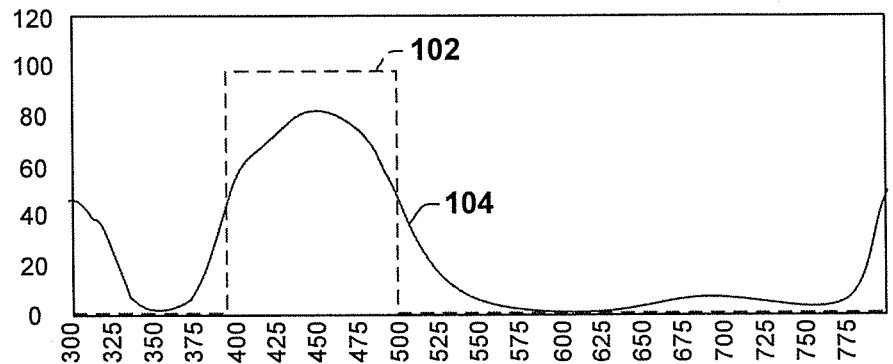
FIGS. 1A-1C show transmission spectra for several different color filters.
Figure 1B:
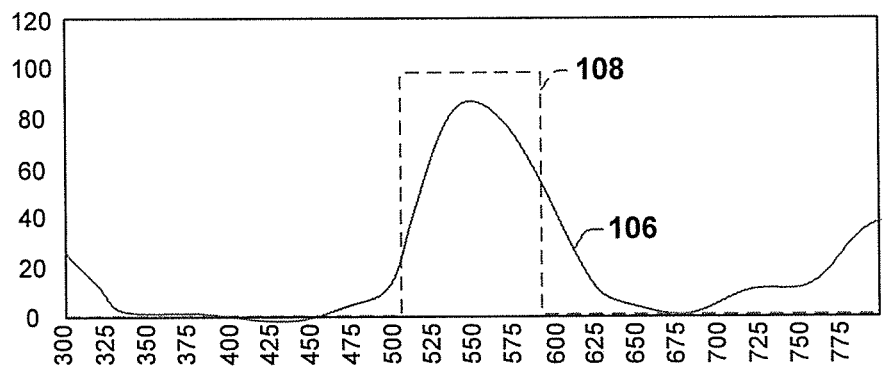
Figure 1C:
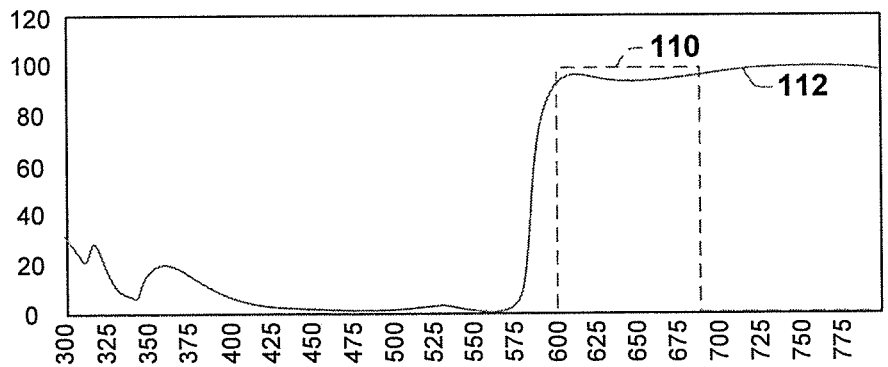

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details.

A plasmon is a quasi-particle resulting from the quantization of plasma, and can be thought of as a quantum of plasma oscillation. Some embodiments of the present disclosure relate to improved optical sensors that make use of plasmonic nanostructures. The size, shape, spacing, and material of the plasmonic nanostructures, as well as the dielectric constant of the surrounding medium, can be set so that the resultant optical sensors exhibit a desired absorption and scattering spectra (e.g., in the ultraviolet or near infrared region of the spectrum). By choosing a suitable combination of size, shape, spacing, and materials, designers can "tune" plasmonic nanostructures to help concentrate transmitted light of a particular frequency or wavelength at a photodetecting element.

Figure 2:
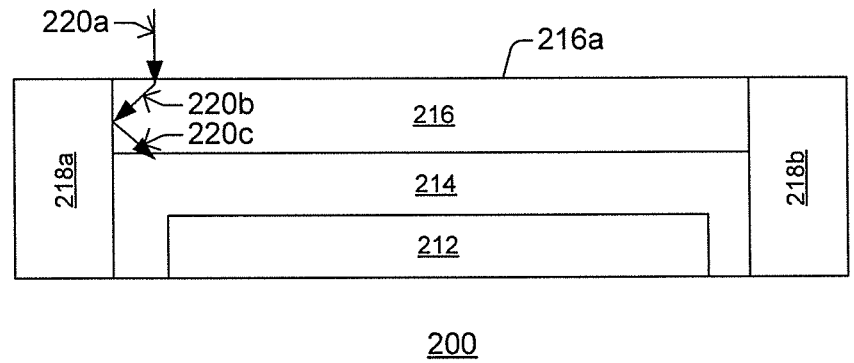
FIG. 2 shows a cross-sectional view of some embodiments of an optical sensor.

FIG. 2 shows an optical sensor 200 in accordance with some embodiments. To detect light, the optical sensor 200 includes a photoelectrical conversion layer 214. When a light in the form of one or more photons strikes this photoelectrical layer 214, a free electron is ejected, which gives rise to a current or voltage across the photoelectrical layer 214. To make use of this current or voltage, a first electrode 212 is formed under or within the photoelectrical conversion layer 214. A second electrode 216, which is transparent, is formed over the photoelectrical conversion layer 214 and is separated from the first electrode 212 by the photoelectrical conversion layer 214. One or both of these electrodes (212 or 216) can include plasmonic nanostructures to help concentrate transmitted light in the photoelectrical conversion layer 214.

Figure 3:
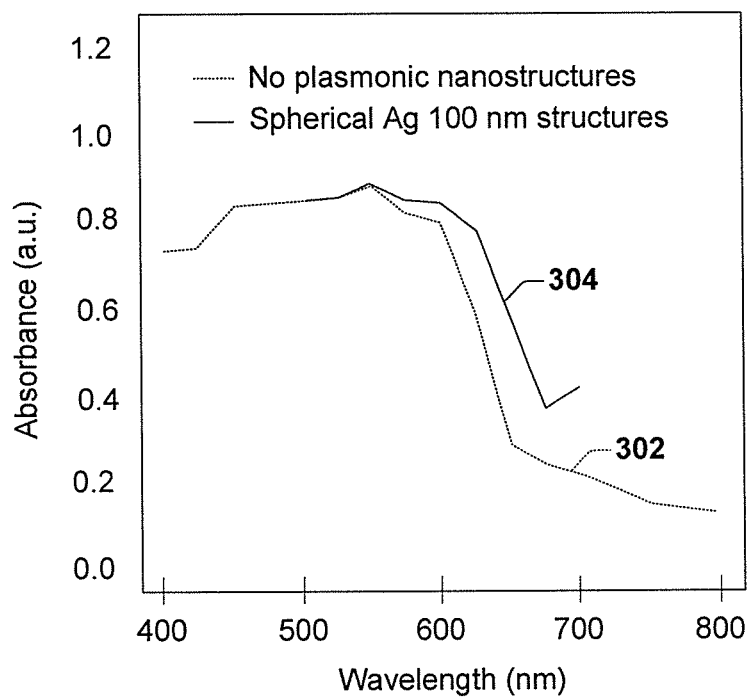
FIG. 3 illustrates absorption spectra for optical sensors in accordance with some embodiments.

To show a more detailed example of how a plasmonic nanostructure, such as can be included in first and/or second electrode 212/216 in FIG. 2, can help improve absorption efficiency of light in a photoelectrical conversion layer, FIG. 3 shows two absorption curves. The first curve 302 corresponds to a simulation of an optical sensor that does not include a plasmonic nanostructure, while the second curve 304 corresponds to a simulation of where a plasmonic nanostructure has been used for solely a first, lower electrode (e.g., FIG. 2, 212). As can be seen by comparing these two curves 302, 304, use of a plasmonic nanostructure for solely the first, lower electrode (e.g., FIG. 2, 212) improves the absorption of photons by the photoelectrical conversion layer (e.g., FIG. 2, 214). In particular, greater absorption of photons is seen for light having wavelengths of between approximately 550 nm and 700 nm, although the size, shape, and materials used in the plasmonic nanostructures could be changed to alter the absorption curves to fit other desired spectrums.

Whereas FIG. 3's simulated curve 304 uses a plasmonic nanostructure for solely the first, lower electrode (e.g., FIG. 2, 212), some embodiments of the present disclosure use plasmonic nanostructures for the first and second electrodes (FIGS. 2, 212 and 216), which can further improve absorbance for optical sensors beyond what is shown in FIG. 3.

Further, because some plasmonic nanostructures may alter the direction of propagation for incident light in an attempt to help better confine the light, plasmonic nanostructures can also at times inadvertently misdirect some light away from the photoelectrical conversion layer 214. For example, FIG. 2's optical sensor 200 can have a plasmonic nanostructure in upper electrode 216, which is aligned directly over the photoelectric conversion layer 214, and can also have a plasmonic nanostructure in lower electrode 212, which is aligned directly under the photoelectric conversion layer 214. For normal incident light 220a (i.e., light approaching photoelectric conversion layer 214 at a perpendicular angle relative to the upper electrode surface 216a), the plasmonic nanostructures can inadvertently scatter or radiate the light so it is diverted away from the photoelectric conversion layer 214 as shown by arrow 220b. To limit absorption losses due to this inadvertent scattering or radiation 220b, FIG. 2's optical sensor 200 also includes sidewall reflectors 218a, 218b. These sidewall reflectors 218a, 218b re-direct diverted light back towards the photoelectric conversion layer 214 as shown by arrow 220c to improve absorption efficiency in photoelectric conversion layer 214. As will be appreciated in more detail below, these sidewall reflectors 218a, 218b are often made of metal, and can be coated with a dielectric material to improve their reflectivity.

Figure 4A:
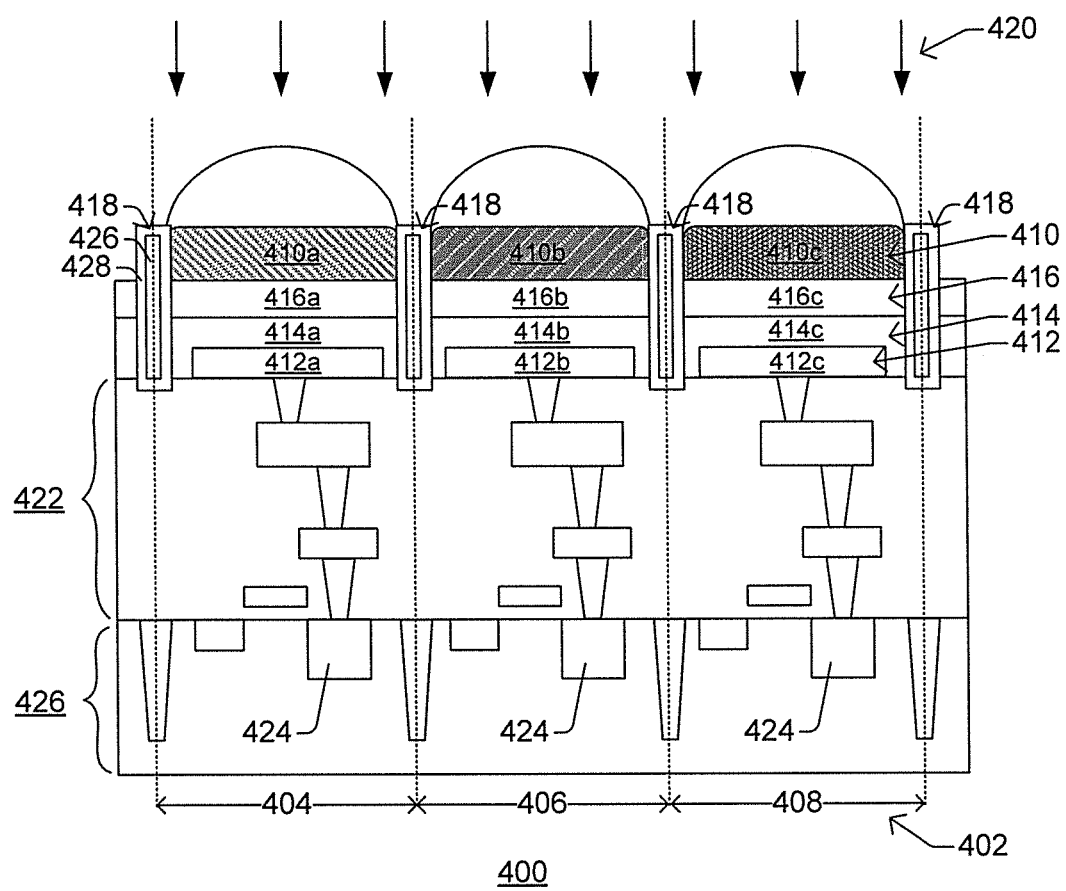
FIG. 4A shows a cross-sectional view of some embodiments of an optical sensor made up of a plurality of pixels.
Figure 4B:
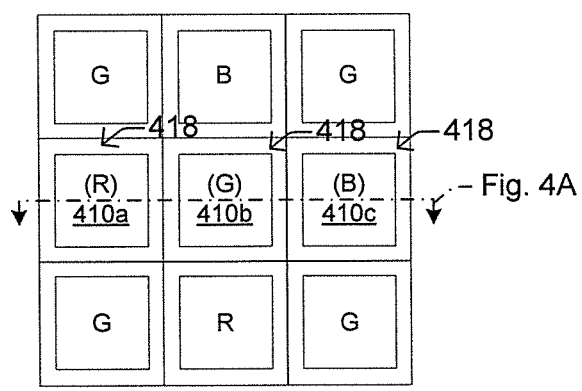
FIG. 4B shows a top view of some embodiments of an optical sensor made up of a plurality of pixels consistent with FIG. 4A.

FIG. 4 shows another example of an optical sensor 400 in accordance with some embodiments. Rather than consisting of a single optical sensor as discussed in FIG. 2's embodiment, the optical sensor 400 is made up of a plurality of individual optical sensors 402 (which can also be referred to as "pixels"). For convenience, FIG. 2 illustrates three pixels 404-408, which will be described below as a red pixel 404, a green pixel 406, and a blue pixel 408. It will be appreciated that although FIG. 4 illustrates three pixels 404-408, optical sensors in accordance with this disclosure can include any number of pixels, ranging from a single pixel to billions or even more pixels. Further, the pixels are often arranged to follow a predetermined pattern, such as in a Bayer filter for example, where green pixels are arranged to correspond to one half of a checkerboard pattern and where the red and blue collectively establish the other half of the checkerboard pattern. See e.g., FIG. 4B. Patterns other than that of a Bayer filter could also be used.

Each pixel 402 includes multiple layers which are stacked on top of one another, and which are formed by photolithography techniques and/or by spin-on coatings, for example. The structure of each pixel 402 is largely the same in that each pixel includes a first electrode layer 412 (which may also be referred to as a "lower plasmonic electrode" in some embodiments), a photoelectric conversion layer 414, a second electrode layer 416 (which may also be referred to as an "upper transparent electrode" in some embodiments), and a plasmonic color filter layer 410. Sidewall reflectors 418 can be arranged between neighboring pixels. As shown in FIGS. 4A-B, each pixel (e.g., first electrode, photoelectrical conversion element, second electrode, and color filter element of the pixel) is laterally bounded by a perimeter that extends vertically from an outer region of the first electrode to an outer region of the color filter element. The sidewall reflectors 418 can be arranged on this perimeter to laterally surround respective pixels to help improve absorption efficiency.

Although the pixels 402 are similar in many respects, the pixels differ from one another in that their plasmonic color filters 410 have different plasmonic nanostructures to provide different wavelength specificity. Thus, each color filter layer 410 passes light of a predetermined frequency range there through, while blocking light of other frequency ranges. For example, the red pixel 404 includes a red plasmonic filter 410a, which allows red light to pass there through while blocking other wavelengths of light (e.g., red plasmonic filter 410a blocks blue and green light). The green pixel 406 includes a green plasmonic filter 410b that allows green light there through while blocking other wavelengths of light (e.g., green plasmonic filter 410b blocks red and blue light). The blue pixel 408 includes a blue plasmonic filter 410c that allows blue light to pass there through while blocking other wavelengths of light (e.g., blue plasmonic filter 410c blocks red and green light). The plasmonic nanostructures of the color filter elements can have different sizes, spacings or materials to provide the desired wavelength specificities. For example, in some embodiments where the plasmonic nanostructures are made of aluminum or copper, which are often low-cost materials commonly used in semiconductor processing: red color filter can have nanostructures with widths of 100-200 nm spaced on a pitch of 200-440 nm; blue color filter can have nanostructures with widths of 60-120 nm spaced on a pitch of 120-360 nm; and green color filter can have nanostructures with widths of 80-180 nm spaced on a pitch of 160-400 nm. These values are merely examples, and actual values can vary widely depending on the application.

During operation, polychromatic light approaches the optical sensor 400 as shown by arrow 420, and strikes the upper surfaces of the plasmonic color filters 410 at a substantially normal angle of incidence, for example. The polychromatic light 420 is filtered to contain only a narrow spectrum of light as it passes through each plasmonic color filter 410. This filtered light then passes through the upper transparent electrodes 416 and strikes the photoelectric conversion layers 414 within each pixel. In the photoelectric conversion layer 414, the light is converted from a photon or electromagnetic wave into an electrical signal, such as a voltage or current. The voltage level or current level, which is established between the first and second electrodes 412, 416 for each pixel, corresponds to the intensity of light that strikes the photoelectric conversion layer 414 for a given pixel. This electrical signal is then passed down through interconnect structures 422 to read out circuitry 424 formed in a semiconductor substrate 426. The read out circuitry 424 then uses an algorithm, such as a demosaicing algorithm, to generate a digital image from the electrical signals provided by the array of pixels.

Notably, the nanostructures of the plasmonic color filters 410 can cause the filtered light, which can have a normal component that perpendicularly strikes an upper surface of the color filters 410, to scatter or be otherwise radiated at non-normal angles of incidence. To help re-direct this scattered or radiated light back to the photoelectric conversion layer 414 of the pixel (and thus help prevent this scattered or radiated light from being inadvertently collected by a photoelectric conversion layer in another pixel), the optical sensor 400 includes sidewall reflectors 418 between neighboring pixels. The sidewall reflectors 418 can be arranged about a perimeter of each pixel, and extend vertically (e.g., perpendicularly between the upper surface of the color filters 410 and a lower surface of the photoelectric conversion layer 414).

The sidewall reflectors 418 are often made of a metal core 426, which can be surrounded or encased by a dielectric coating 428. The dielectric coating 428, such as a low-k dielectric, can help to better reflect light back towards the photoelectric conversion layer 414 of the pixel.

Figure 5:
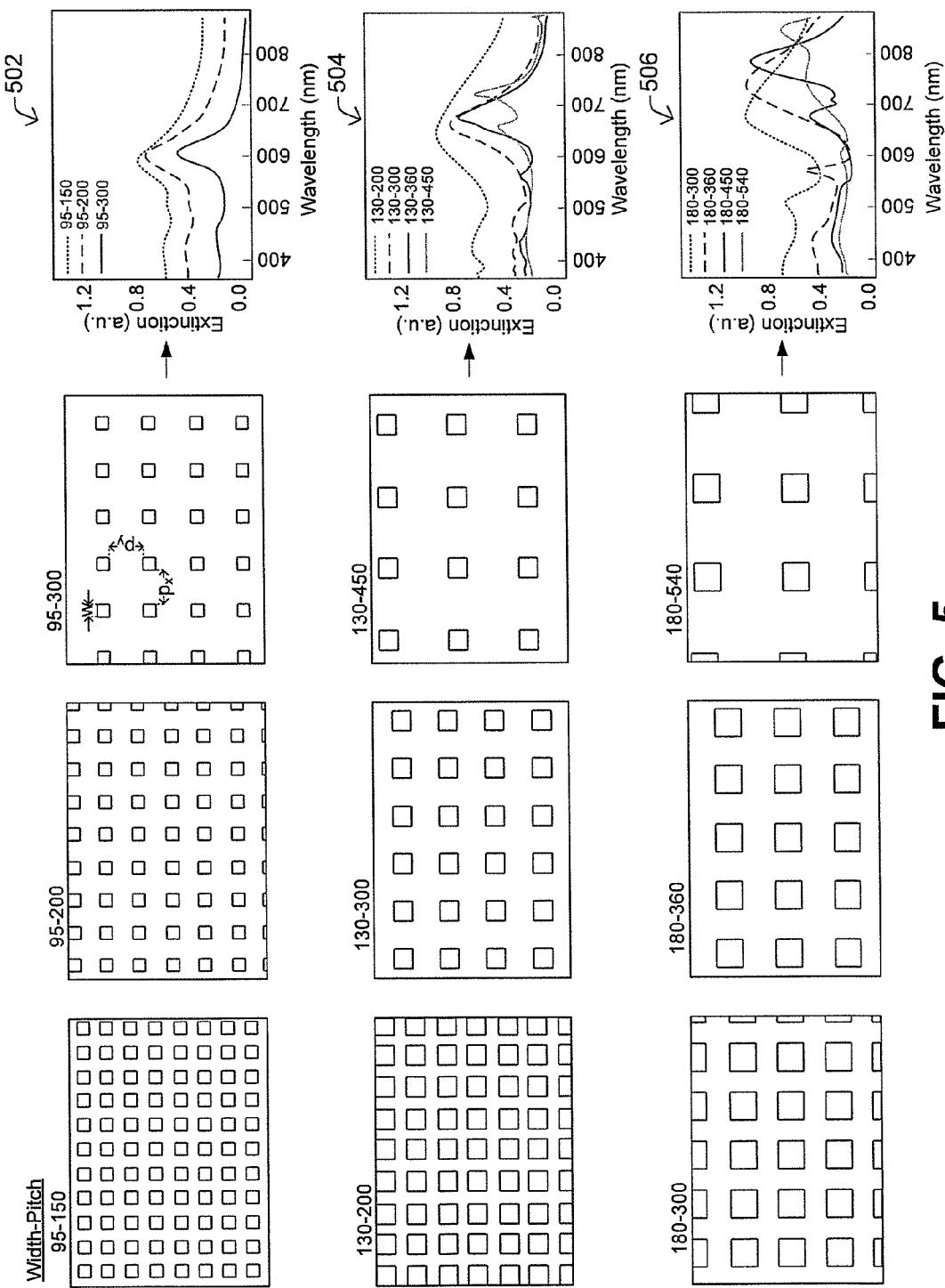
FIG. 5 depicts some embodiments of top views of plasmonic nanostructures with different widths and spacings along with their corresponding transmission spectrums.

To show an example of how the nanostructures of the plasmonic color filters (e.g., FIG. 4, 410) and/or plasmonic electrode(s) (e.g., FIG. 4, 412 and/or 416) can be arranged, FIG. 5 shows several examples where the nanostructures comprise metal pillars that are arranged in grid-like fashion. As can be appreciated from FIG. 5, as the size, shape, and spacing of metal pillars is changed, the spectrum of light that is confined by the plasmonic nanostructure is changed.

More particularly, the first row of FIG. 5 shows a series of three different plasmonic nanostructures, each of includes box-like pillars having square bases with equal widths, w, of approximately 95 nm. As one moves along the first row of pictures from left to right (each picture corresponds to a different plasmonic nanostructure having box-like pillars of width 95 nm), the pitches, $p_x$, $p_y$, between the neighboring pillars is increased from 150 nm (far left picture) to 300 nm (far right picture). As can be seen from the graph 502 of the right hand side of the first row, changing the pitch between neighboring pillars changes the amount of light transmitted through the color filter, and can also change the wavelength of light which passes through the filter. The second row shows pillars having a width of approximately 130 nm and pitch varying from 200 to 450 nm, along with a corresponding transmission spectrum 504. The third row shows pillars having a width of approximately 180 nm and pitch varying from 300 to 540 nm, along with a corresponding transmission spectrum 506. Thus, FIG. 5 shows one example of how the size and spacing of between structures can alter the spectrums of transmitted/confined light.

Although FIG. 5 shows an example where box-like pillars are used for the plasmonic nanostructures, other nanostructures can also be used, such as rectangles, circles, ellipses, polygons, or other shapes. The individual structures of the nanostructures can be made of metal, such as silver, gold, aluminum, copper, platinum, palladium, and/or nickel. The metal can be arranged in a grid, series of pillars, series of gratings or holes, a particle array or a random distribution. In some embodiments, the individual nanostructures range from approximately 5-500 nm in width, and neighboring nanostructures are spaced apart by approximately 5-1000 nm.

Figure 6A:
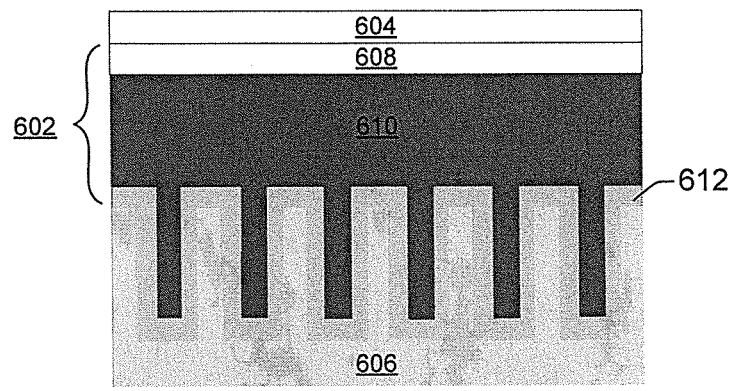
FIGS. 6A-6C illustrate some embodiments of cross-sectional views of photoelectric conversion layers.
Figure 6B:
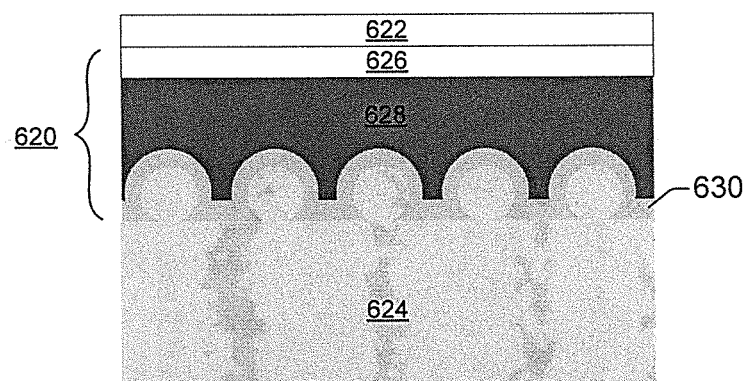
Figure 6C:
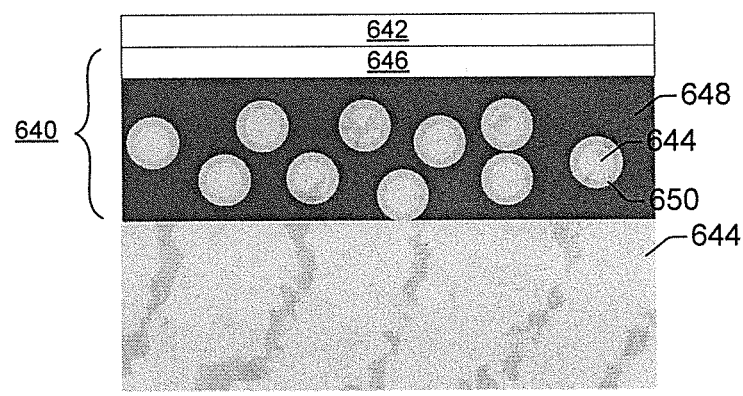

FIGS. 6A-6C show cross-sectional views of several different embodiments of photoelectric conversion layers (e.g., 214 in FIG. 2 or 414 in FIG. 4). In general, photoelectric conversion layers include a p-type layer and an n-type layer. In some embodiments, the p-type layer directly abuts the n-type layer to form a p-n junction, but in other embodiments an intrinsic semiconductor layer is arranged between the p- and n-type layers to form a PIN junction.

More particularly, FIG. 6A depicts a photoelectric conversion layer 602 that is arranged between an upper (e.g., transparent) electrode 604 and a lower plasmonic nanostructure electrode 606. The photoelectrical conversion layer 602 includes a hole transport/electron blocking layer 608, a p-type organic layer 610, and an n n-type hole blocking layer 612. During operation, the upper electrode 604 can act as an anode, while the lower electrode 606 can act as a cathode.

The plasmonic nanostructure electrode 606 can be made of metal, such as silver, gold, aluminum, copper, platinum, palladium, and/or nickel. The illustrated plasmonic nanostructure in FIG. 6A is a series of pillars arranged in a grid, but could also be a series of gratings or holes, a particle array, or a random distribution. In some embodiments, the individual nanostructures range from approximately 5-500 nm in width, and neighboring nanostructures are spaced apart by approximately 5-1000 nm.

The hole blocking layer 608 can be made of an n-type oxide, such as LiF, PCBM, or a high-k dielectric (e.g., Ta2O5, TiO2, SnO2).

The p-type organic material 610 can include organic conjugated polymer and small molecule.

The hole transport/electron blocking layer 608 can include PEDOT:PSS, high K (MoO3, NiO, CuO, WO3, V2O5).

The upper transparent electrode 604 can include ITO, FTO, AZO, and/or IGZO. Although the upper transparent electrode 604 is illustrated as a planar layer, the upper transparent electrode 604 can also be made of plasmonic nanostructures. These plasmonic nanostructures can be arranged in a grid, series of pillars, series of gratings or holes, a particle array or a random distribution. The plasmonic nanostructures of the upper transparent electrode 604 can be the same size, shape and spacing as the lower electrode 606, or can have a size, shape, and/or spacing that differs from that of the lower electrode 606.

FIG. 6B shows another example of a photoelectric conversion layer 620 that is arranged between an upper (e.g., transparent) electrode 622 and a lower plasmonic nanostructure electrode 624. The photoelectrical conversion layer 620 includes a hole transport/electron blocking layer 626, a p-type organic layer 628, and an n n-type hole blocking layer 630. During operation, the upper electrode 622 can act as an anode, while the lower electrode 624 can act as a cathode.

The plasmonic nanostructure electrode 624 can be made of metal, such as silver, gold, aluminum, copper, platinum, palladium, and/or nickel. In FIG. 6B's embodiment, the plasmonic nanostructure electrode 624 includes a series of spheres, rods, or other rounded structures that are arranged at regular intervals or non-regular (e.g., random) intervals on an upper planar surface of the plasmonic nanostructure electrode. In some embodiments, the individual nanostructures range from approximately 5-500 nm in width, and neighboring nanostructures are spaced apart by approximately 5-1000 nm. The spheres, rods, or other structures could be sprayed on the upper planar surface, or could be formed by applying a solution containing the structures, such as by spin coating for example.

FIG. 6C shows another example of a photoelectric conversion layer 640 that is arranged between an upper (e.g., transparent) electrode 642 and a lower plasmonic nanostructure electrode 644. The photoelectrical conversion layer 640 includes a hole transport/electron blocking layer 646, a p-type organic layer 648, and an n n-type hole blocking layer 650. During operation, the upper electrode 642 can act as an anode, while the lower electrode 644 can act as a cathode.

The plasmonic nanostructure electrode 644 can be made of metal, such as silver, gold, aluminum, copper, platinum, palladium, and/or nickel. In FIG. 6C's example, this metal of the electrode 644 is fashioned as rods, spheres or other structures that are suspended in the p-type organic layer 648. The suspended spheres, rods, or other structures could be formed by applying a solution containing the structures over a planar portion of electrode 644, such as by spin coating for example.

Thus, it will be appreciated that some embodiments relate to an optical sensor. The optical sensor includes a first electrode disposed over a semiconductor substrate. A photoelectrical conversion element, which includes a p-type layer and an n-type layer, is arranged over the first electrode to convert one or more photons having wavelength falling within a predetermined wavelength range into an electrical signal. A second electrode, which is transparent in the predetermined wavelength range, is disposed over the photoelectrical conversion element. A color filter element is made up of plasmonic nanostructures and is disposed over the second electrode.

Some embodiments relate to another optical sensor. In this optical sensor, a first electrode is disposed over a semiconductor substrate. A photoelectrical conversion element, which includes a p-type layer and an n-type layer, is arranged over the first electrode to convert one or more photons having wavelength falling within a predetermined wavelength range into an electrical signal. A second electrode, is transparent in the predetermined wavelength range, is disposed over the photoelectrical conversion element. The first and second electrodes are each made up of plasmonic nanostructures.

Some embodiments relate to still another optical sensor. This optical sensor includes an array of photoelectrical conversion elements arranged over a semiconductor substrate. An array of plasmonic color filters is arranged over the array of photoelectrical conversion elements. Respective plasmonic color filters are arranged over respective photoelectrical conversion elements. A sidewall reflector is arranged about a perimeter of a photoelectrical conversion element and is arranged to reflect light back towards the photoelectrical conversion element. The sidewall reflector includes a metal core with a dielectric coating on at least one sidewall thereof.

Although the disclosure has been shown and described with respect to one or more implementations, equivalent alterations and modifications will occur to others skilled in the art based upon a reading and understanding of this specification and the annexed drawings. For example, it will be appreciated that identifiers such as "first" and "second" do not imply any type of ordering or placement with respect to other elements; but rather "first" and "second" and other similar identifiers are just generic identifiers. In addition, it will be appreciated that the term "coupled" includes direct and indirect coupling. The disclosure includes all such modifications and alterations and is limited only by the scope of the following claims. In particular regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. In addition, the articles "a" and "an" as used in this application and the appended claims are to be construed to mean "one or more".

Furthermore, to the extent that the terms "includes", "having", "has", "with", or variants thereof are used in either the detailed description or the claims, such terms are intended to be inclusive in a manner similar to the term "comprising."

What is claimed is:

1. An optical sensor, comprising:
   a first electrode disposed over a semiconductor substrate;
   a photoelectrical conversion element, which includes a p-type layer and an n-type layer, arranged over the first electrode to convert one or more photons having wavelength falling within a predetermined wavelength range into an electrical signal;
   a second electrode disposed over the photoelectrical conversion element, wherein the second electrode is transparent in the predetermined wavelength range; and
   a color filter element which is made up of plasmonic nanostructures and which is disposed over the second electrode.

2. The optical sensor of claim 1, wherein the first electrode, photoelectrical conversion element, second electrode, and color filter element are each laterally bounded by a perimeter that extends vertically from an outer region of the color filter element to an outer region of the first electrode.

3. The optical sensor of claim 2, further comprising:
   a sidewall reflector arranged about the perimeter and arranged to redirect photons that pass through the color filter element at a non-normal angle back towards photoelectrical conversion element of the optical sensor.

4. The optical sensor of claim 3, wherein the sidewall reflector includes a metal core with a dielectric coating on a sidewall thereof.

5. The optical sensor of claim 1, wherein the first or second electrode is made up of plasmonic nanostructures.

6. The optical sensor of claim 1, wherein a plasmonic nanostructure of the color filter element comprises:
   a grid or array of plasmomonic nanostructures where individual plasmonic nanostructures have widths in a range of 5 nm to 500 nm, and where neighboring plasmonic nanostructures are spaced apart in a range of 5 nm to 1000 nm.

7. The optical sensor of claim 1, where the first or second electrode is a plasmonic electrode comprising an arrangement of metallic pillars extending upwardly away from the semiconductor substrate and wherein the n-type layer is conformally disposed over the metallic pillars.

8. The optical sensor of claim 7, wherein the p-type layer is conformally disposed over the n-type layer so as to abut the n-type layer.

9. The optical sensor of claim 1, wherein the first or second electrode is a plasmonic electrode that comprises an arrangement of approximately spherical or rod-like regions suspended in the p-type or n-type layer.

10. The optical sensor of claim 1, wherein the first or second electrode is a plasmonic electrode that comprises an arrangement of approximately spherical or rod-like regions arranged on a planar metal surface.

11. The optical sensor of claim 1, further comprising:
    a read out circuit in the substrate under the photoelectric conversion element.

12. An optical sensor, comprising:
    a first electrode disposed over a semiconductor substrate;
    a photoelectrical conversion element, which includes a p-type layer and an n-type layer, arranged over the first electrode to convert one or more photons having wavelength falling within a predetermined wavelength range into an electrical signal; and
    a second electrode disposed over the photoelectrical conversion element, wherein the second electrode is transparent in the predetermined wavelength range;
    wherein the first and second electrodes are each made up of plasmonic nanostructures.

13. The optical sensor of claim 12, further comprising:
    a color filter element which is made up of plasmonic nanostructures and which is disposed over the second electrode.

14. The optical sensor of claim 13, further comprising a sidewall reflector laterally bounding a perimeter that extends vertically from an outer region of the first electrode to an outer region of the color filter element.

15. The optical sensor of claim 14, wherein the sidewall reflector is arranged to redirect photons that pass through the color filter element at a non-normal angle back towards photoelectrical conversion element of the optical sensor.

16. The optical sensor of claim 12, wherein the first electrode comprises metal, the p-type layer comprises an organic material, the n-type layer comprises an oxide, and the second electrode comprises at least one of: ITO, FIO, AZO, or IGZO.

17. An optical sensor, comprising:
    an array of photoelectrical conversion elements arranged over a semiconductor substrate;
    an array of plasmonic color filters arranged over the array of photoelectrical conversion elements, wherein respective plasmonic color filters are arranged over respective photoelectrical conversion elements; and
    a sidewall reflector arranged about a perimeter of a photoelectrical conversion element and arranged to reflect light back towards the photoelectrical conversion element, wherein the sidewall reflector includes a metal core with a dielectric coating on at least one sidewall thereof.

18. The optical sensor of claim 17, wherein the array of plasmonic color filters include at least three different arrangements of nanostructures, wherein each of the three nanostructure arrangements includes nanostructures that have a width or an approximate spacing between adjacent nanostructures that is different from the other nanostructure arrangements.

19. The optical sensor of claim 18, wherein a first plasmonic color filter includes a first arrangement of nanostructures, wherein a nanostructure of the first arrangement has a first width and is spaced apart from neighboring nanostructures in the first arrangement by approximately a first distance.

20. The optical sensor of claim 19, wherein a second plasmonic color filter includes a second arrangement of nanostructures that differs from the first arrangement, wherein a nanostructure of the second arrangement has a second width and is spaced apart from neighboring nanostructures in the second arrangement by approximately a second distance.

* * * * *